United States Patent [19]

Motoyoshi

[11] 4,218,522
[45] Aug. 19, 1980

[54] BATTERY MOUNTING DEVICE
[75] Inventor: Junichi Motoyoshi, Ichikawa, Japan
[73] Assignee: Canon Kabushiki Kaisha, Tokyo, Japan
[21] Appl. No.: 55,807
[22] Filed: Jul. 9, 1979
[30] Foreign Application Priority Data Jul. 13, 1978 [JP] Japan .................................. 53-85457

[51] Int. Cl.² ............................................. H01M 2/10
[52] U.S. Cl. ........................................ 429/97; 429/176; 206/333
[58] Field of Search .................... 429/97, 96, 100, 175, 429/176; 206/333

[56] References Cited

U.S. PATENT DOCUMENTS

| | | | |
|---|---|---|---|
| 4,072,800 | 2/1978 | Gammer | 429/97 |
| 4,129,688 | 12/1978 | Fischer et al. | 429/97 |
| 4,146,682 | 3/1979 | Nakao | 429/97 |

Primary Examiner—Charles F. Lefevour
Attorney, Agent, or Firm—Fitzpatrick, Cella, Harper & Scinto

[57] ABSTRACT

A battery mounting device comprising an electroconductive battery cover maintained in contact with an electrode face of a battery placed on a contact provided inside an electronic apparatus, and a latch member provided between said battery cover and said contact inside the electronic apparatus, said latch member being provided with slanted faces for biasing said battery cover in a direction for pressing the battery when said latch member is brought into a latched position by turning the battery cover.

6 Claims, 6 Drawing Figures

BATTERY MOUNTING DEVICE

BACKGROUND OF THE INVENTION

1. Field of the Invention

The present invention relates to a mounting device for a thin so-called coin-type battery frequently used in various thin electronic apparatus such as pocketable electronic calculators.

2. Description of the Prior Art

Recently coin-type batteries have been widely used in various small electronic apparatus, but the mounting of the batteries in the electronic apparatus requires a rather complicated structure necessitating a large number of parts and a lengthy assembling procedure, thus naturally resulting in a complicated battery exchanging procedure for the user. The object of the present invention is to avoid the above-mentioned drawback.

DESCRIPTION OF THE PREFERRED EMBODIMENTS

Figure 1:
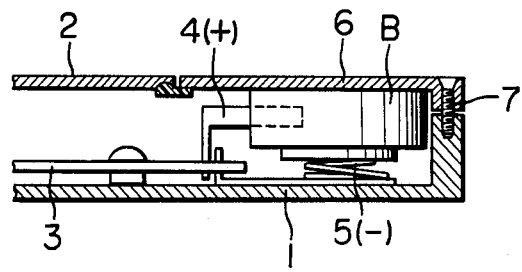
FIG. 1 is a lateral cross-sectional view of a conventional battery mounting device.

In a conventional mounting structure shown in FIG. 1, there are provided a casing 1 of the apparatus, a cover 2, a printed circuit board 3, and a coin-type battery B. In order to support said battery in the casing 1, there are provided a positive terminal 4 and a negative terminal 5 respectively connected, by soldering or caulking, electrically to the positive and negative patterns of said printed circuit board. 6 is a battery cover, and 7 is a fixing screw therefor.

As shown in the foregoing, the conventional structure requires a large number of component parts and of assembling steps. Also such structure cannot be made thin since the contacts 4 and 5 have to be formed as spring structures in order to absorb the fluctuation in the diameter and thickness of the battery B and to obtain a required contact pressure.

The device of the present invention is featured by latch members provided respectively on a positive terminal placed in the electronic apparatus and on an electroconductive battery cover for being maintained in contact with the positive electrode of the coin-type battery placed on a negative contact in the electronic apparatus, said latch members being provided with slanted faces which are designed to mutually engage to bias said battery cover toward the battery when said battery cover is turned with respect to the positive contact in the electronic apparatus.

Figure 2:
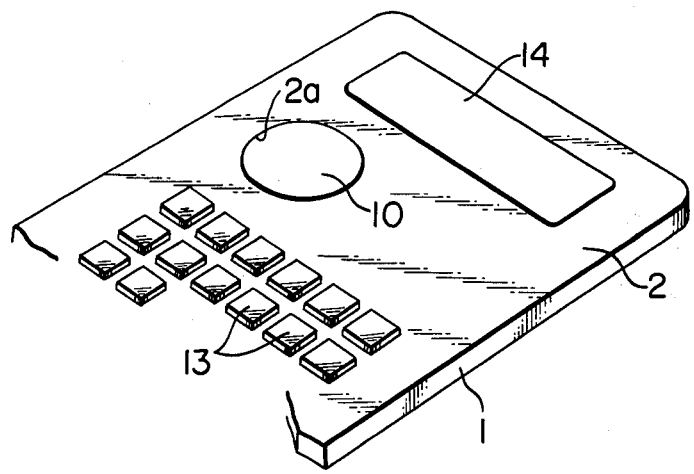
FIG. 2 is a perspective view of an electronic apparatus embodying the present invention.
Figure 3:
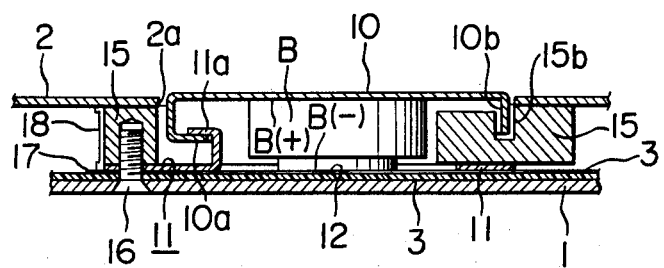
FIG. 3 is an enlarged lateral cross-sectional view of the device of the present invention.
Figure 4:
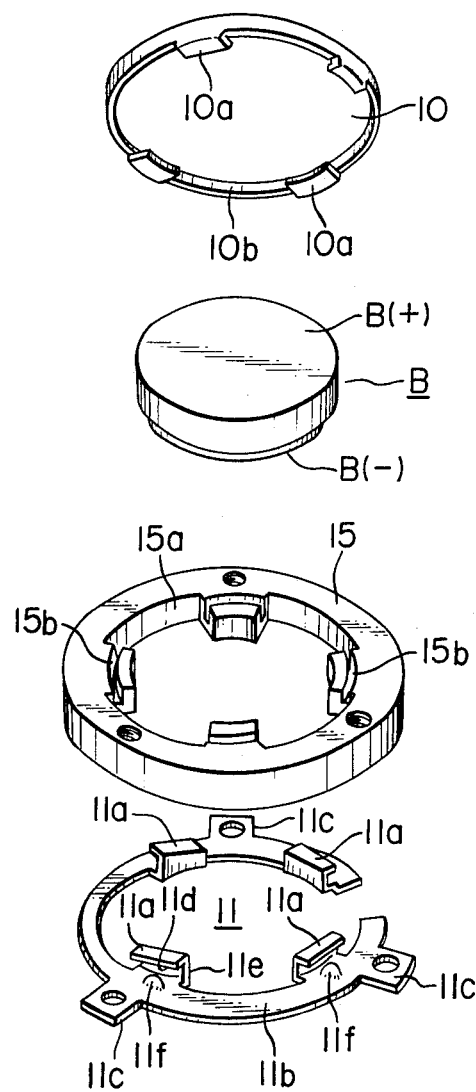
FIG. 4 is an exploded perspective view of the component parts of said device.
Figure 5:
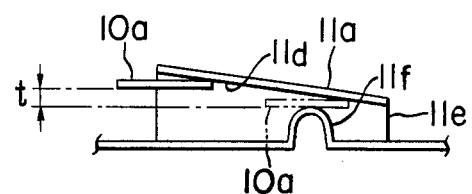
FIG. 5 is an explanatory view of the slanted faces of the latch member.
Figure 6:
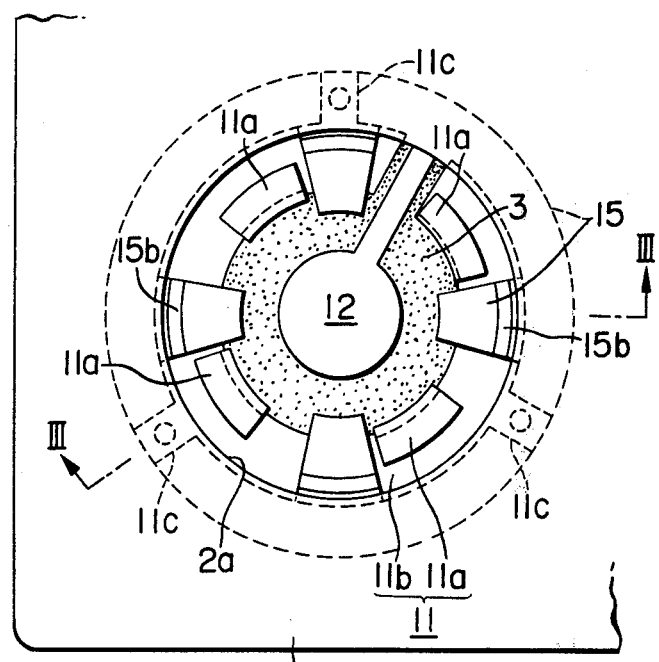
FIG. 6 is a plan view of the battery mounting portion of the electronic apparatus.

More specifically referring to FIG. 2 showing an embodiment of the battery mounting device applied on a pocketabe electronic calculator, there are shown a battery cover 10, push-buttons 13 and a display window 14. Referring to FIG. 3 showing, in an enlarged lateral cross-sectional view, the battery mounting portion of said calculator, there is provided, on the bottom of the casing 1, a printed circuit board 3 of which an electroconductive pattern 12 functions as the negative contact for supporting the cathode face B(−) of the battery while another electroconductive pattern 17 supports a positive contact 11. As shown in FIG. 4, said positive contact 11 is composed of a metal plate ring 11b provided on the internal periphery thereof with plural U-shaped integral latches 11a distributed at approximately equal intervals, and further provided on the outer periphery thereof with projecting portions 11c for mounting. Other U-shaped latches 10a corresponding to said U-shaped latches 11a are provided in corresponding number on the internal face of the battery cover 10, and the engaging faces 11d of the latches 11a or those of both latches 10a and 11a are made as a slanted structure as shown in a developed view in FIG. 5. 15 is a guide for the battery cover 10 and composed of an insulating annular member of a thickness for defining the spacing between the bottom cover 1 and upper cover 2 of the casing, said guide being further provided with recesses 15a for receiving and defining the rotating movement of the latches 10a, 11a and guide grooves 15b for receiving tubular rim 10b of said battery cover 10. 16 are screws for fixing the positive contact 11, guide 15 and printed circuit board 3 to the bottom of the casing.

When the coin-type battery B is placed on the negative contact 12 through a hole 2a of the upper cover 2 and the battery cover 10 fitted in said hole 2a is rotated from a non-engaging position of the latches 10a and 11a, the latches 10a become engaged with said latches 11a of the contact 11 and biased by the slanted faces 11d thereof to press said battery B thereby maintaining the cathode face thereof in pressure contact with the negative contact 12a. The contact 11 is provided with projecting stoppers 11f for preventing eventual interruption of electrical contact when the battery cover 10, and thus the latches 10a, are pressed downwards.

As explained in the foregoing, the battery mounting device of the present invention requires a reduced number of component parts and thus can be assembled in a simple manner. Also the slanted-face structure utilized for biasing the battery allows absorption of the eventual fluctuation t (FIG. 5) in the thickness of the battery or is applicable to various batteries of different sizes. Furthermore the device of the present invention assures a simple exchange of the battery. In case of thin calculators the upper cover 2 is often made of a metal plate in order to achieve a required strength of the apparatus, and in such case said metal plate 2 is preferably maintained at a same potential as that of the battery cover 10 in order to dispense with the insulation therebetween. For this purpose, as shown in FIG. 3, there is provided a shortcircuiting terminal 18 for making electric connection between the parts 2, 17, 11, and 10.

What I claim is:

1. A battery mounting device, comprising:
   a casing of an electronic apparatus;
   a negative contact provided in said casing;
   a positive contact provided in said casing;
   an electroconductive battery cover to be maintained in contact with the anode face of a battery; and
   engaging latch members provided between said electroconductive battery cover and said positive contact, and provided with slanted faces structured to bias said battery toward said negative contact when said battery cover is turned.

2. A battery mounting device according to the claim 1, wherein said negative contact is composed of an electroconductive pattern on a printed circuit board, and said positive contact is placed on another electroconductive pattern on said printed circuit board.

3. A battery mounting device according to the claim 1, wherein said positive contact is shaped in an annular form to encircle said negative contact, and said latches are positioned at approximately uniform angular intervals around the center of said annular form.

4. A battery mounting device according to the claim 1, wherein said positive contact is provided with stoppers for stopping the battery cover against depressive movement thereof.

5. A battery mounting device according to the claim 1, wherein the upper cover of said electronic apparatus is composed of a metal which is maintained at a same potential as that of said battery cover.

6. A battery mounting device according to the claim 1, wherein said electronic apparatus comprises a thin pocketable electronic calculator.

* * * * *